(12) United States Patent
Chuang et al.

(10) Patent No.: US 10,991,758 B2
(45) Date of Patent: Apr. 27, 2021

(54) SEMICONDUCTOR STRUCTURE

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Kuei-Hung Shen, Hsinchu (TW); Hsun-Chung Kuang, Hsinchu (TW); Cheng-Yuan Tsai, Hsin-Chu County (TW); Ru-Liang Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/418,445

(22) Filed: May 21, 2019

(65) Prior Publication Data

US 2019/0273118 A1  Sep. 5, 2019

Related U.S. Application Data

(60) Continuation of application No. 15/867,427, filed on Jan. 10, 2018, now Pat. No. 10,304,903, which is a
(Continued)

(51) Int. Cl.
*H01L 27/22* (2006.01)
*H01L 43/02* (2006.01)
(Continued)

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC ....... H01L 27/222; H01L 43/12; H01L 43/08; H01L 27/228; H01L 29/788; H01L 21/306; H01L 21/31051; H01L 21/31111; H01L 21/76224; H01L 29/0653; H01L 29/42328; H01L 29/4916; H01L 29/66545; H01L 29/66825
(Continued)

(56) References Cited

U.S. PATENT DOCUMENTS

2003/0203509 A1* 10/2003 Rizzo ................ B82Y 10/00
438/3
2012/0190191 A1* 7/2012 Shih ................ H01L 21/02074
438/643
(Continued)

*Primary Examiner* — Mouloucoulaye Inoussa
(74) *Attorney, Agent, or Firm* — WPAT, P.C., Intellectual Property Attorneys; Anthony King

(57) ABSTRACT

The present disclosure provides a semiconductor structure. The semiconductor structure includes a bottom electrode via (BEVA) in a dielectric layer, a recap layer on the BEVA, a bottom electrode on the recap layer, and a magnetic tunneling junction (MTJ) layer over the recap layer and vertically aligning with the BEVA. The BEVA includes a lining layer over a bottom and a sidewall of a trench of the BEVA and a copper layer over the lining layer, filling the trench of the BEVA. The copper layer has a dimpled structure with a top surface lower than a top surface of the dielectric layer. The recap layer overlaps a top surface of the lining layer, an entire top surface of the copper layer, and a portion of the dielectric stack adjacent to the lining layer.

20 Claims, 29 Drawing Sheets

Related U.S. Application Data division of application No. 15/130,065, filed on Apr. 15, 2016, now Pat. No. 9,893,120.

(51) Int. Cl.
*H01L 43/08* (2006.01)
*H01L 43/12* (2006.01)

(58) Field of Classification Search
USPC ............. 257/421, 315, 316; 438/3, 587, 593
See application file for complete search history.

(56) References Cited

U.S. PATENT DOCUMENTS

2015/0295172 A1* 10/2015 Sung .................... H01L 45/1233
257/2
2017/0084820 A1* 3/2017 Tan ......................... H01L 43/08

\* cited by examiner

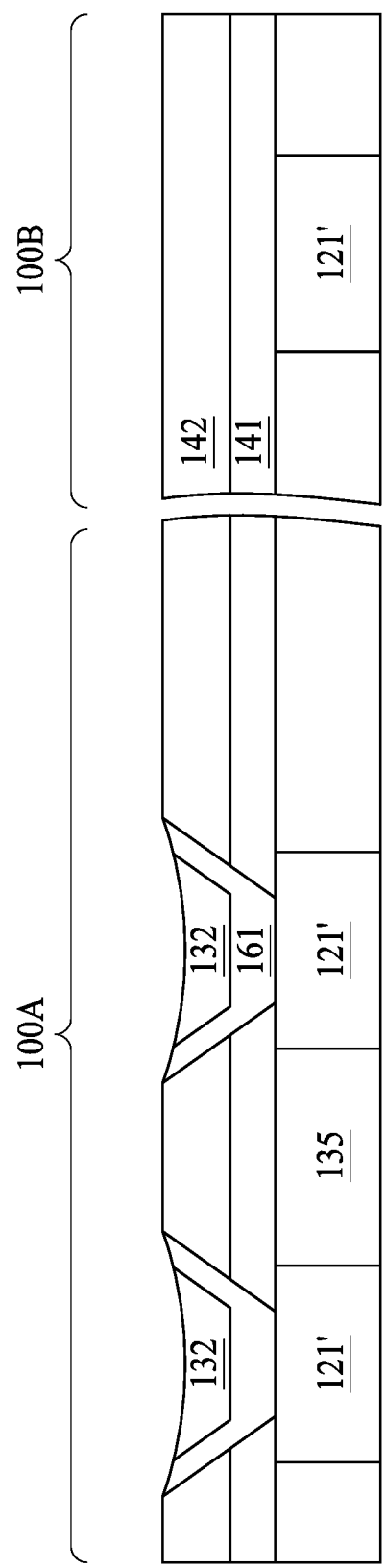

SEMICONDUCTOR STRUCTURE

CROSS REFERENCE TO RELATED APPLICATIONS

Present application is a continuation of U.S. application Ser. No. 15/867,427, filed on Jan. 10, 2018, which is a division of U.S. application Ser. No. 15/130,065, filed on Apr. 15, 2016. All of the above-referenced applications are hereby incorporated herein by reference in their entirety.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4K are cross sections of a first semiconductor structure fabricated at various operations, in accordance with some embodiments of the present disclosure.

DETAILED DESCRIPTION

Figure 1A:
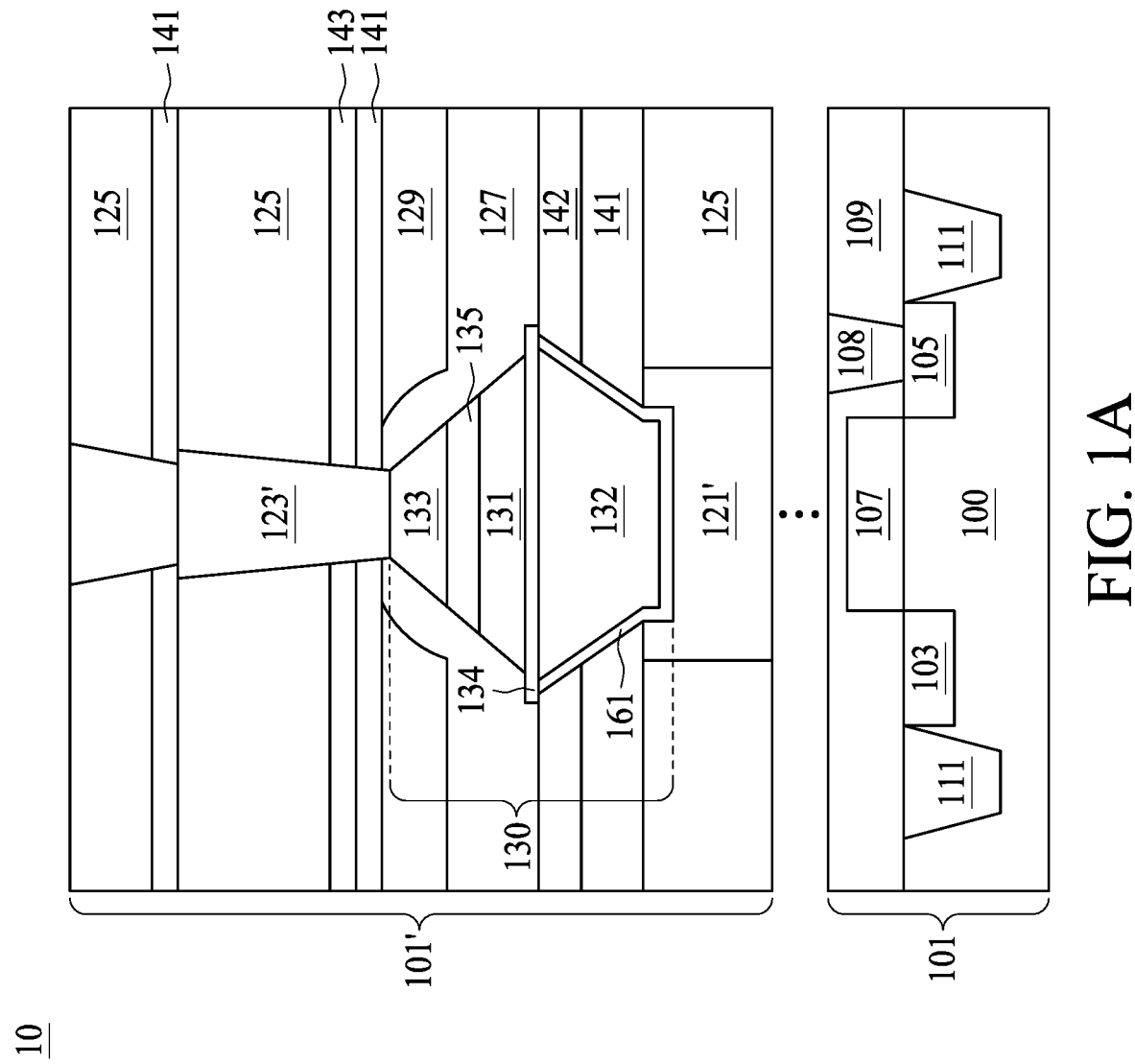
FIG. 1A is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer through a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

Conventionally the bottom electrode of the MRAM includes a bottom electrode via (BEVA) and a portion above the BEVA but under the MTJ. The surface roughness of the BEVA is crucial because a highly rough BEVA surface would carry said morphology to the MTJ layers, which extremely demand film flatness with respect to memory performance. In other words, if the surface of the BEVA is not smooth enough utilizing optimized growth technique or planarization technique, the MRAM performance can be seriously deteriorated.

Normally TiN/TaN chemical vapor deposition (CVD) is performed to fill the BEVA hole and obtain a flat surface by a planarization operation such as chemical mechanical polishing (CMP). However, because the density of the lattice of TiN or TaN is not uniform, a preferred grain-growth region in a shape of a cone would formed, rending a portion of the top surface of the BEVA hole to bulge. The existing approaches merely apply a CMP operation on the BEVA surface to planarize the bulge. However, even if the bulge could be alleviated by the CMP operation, the lattice density uniformity problem would cause the subsequently-deposited bottom electrode portion to bulge again. Therefore, the bulge increases the roughness of the MTJ, which would degrade the performance of the MRAM. Apart from the crystal grain growth limitation as descried above, the TiN/TaN CVD-filled BEVA frequently forms a seam at the top surface of the BEVA due to CVD filling limitation. Similarly, the seam enhances the roughness of said surface and would carry said morphology to the MTJ layers.

In accordance with some embodiments of the present disclosure, a semiconductor structure is provided to have a BEVA formed by an electroplating operation instead of a CVD. For example, the BEVA hole is filled by electroplated copper and followed by a multi-stage CMP operation in order to achieve a desired BEVA surface roughness. In some embodiments, the semiconductor structure has a node 16 nm or beyond feature.

In accordance with some embodiments of the present disclosure, a semiconductor structure is provided to have an electroplated BEVA covered by an additional recap layer. The recap layer is further deposited over the BEVA surface to eliminate a stair profile inevitably generated at heteroboundaries between the electroplated BEVA and the surrounding dielectric layer after the planarization operation such as a CMP. (contemplate to be one embodiment or combine with the e-plate)

In accordance with some embodiments of the present disclosure, a manufacturing method of the semiconductor structure described herein is provided.

Referring to FIG. 1A, FIG. 1A is a cross section of a semiconductor structure 10, in accordance with some embodiments of the present disclosure. The semiconductor structure 10 includes a transistor structure 101 and a metallization structure 101'. In some embodiments, the semiconductor substrate 100 of the transistor structure 101 may be but is not limited to, for example, a silicon substrate. In an embodiment, substrate 100 is a semiconductor substrate, such as a silicon substrate, although it may include other semiconductor materials, such as silicon germanium, silicon carbide, gallium arsenide, or the like. In the present embodiment, the semiconductor substrate 100 is a p-type semiconductor substrate (P-Substrate) or an n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combination thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 107. Contact plugs 108 are formed in inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 1A shows a planar transistor having a doped region in the semiconductor substrate 100. However, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STI 111 are formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

Referring to FIG. 1A, a metallization structure 101' is disposed above the transistor structure 101. Because the $N^{th}$ metal layer 121 may not be the first metal layer over the transistor structure 101, the omission of a portion of the metallization structure 101' is represented by dots. An MRAM structure 130 is disposed between an $N^{th}$ metal line 121' and an $(N+1)^{th}$ metal line 123'. Interconnect structure includes a plurality of metal layers, namely $M_1$, $M_2$ ... $M_N$. Throughout the description, the term "metal layer" refers to the collection of the metal lines in the same layer. Metal layers M1 through MN are formed in inter-metal dielectrics (IMDs) 125, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 125 may also be close to 3.8. In some embodiments, the k values of the low-k dielectric materials are lower than about 3.0, and may be lower than about 2.5. The $N^{th}$ metal via 122 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In FIG. 1A, the MRAM structure 130 at least includes a bottom electrode via (BEVA) 132, a recap layer 134, a bottom electrode 131, a top electrode 133, and an MTJ 135. The BEVA 132 is on the $N^{th}$ metal line 121'. In some embodiments, a planarization operation, such as a chemical mechanical polishing (CMP) operation, may be applied to a top surface of the BEVA 132. In some embodiments, the BEVA 132 trench possesses a trapezoidal recess surrounded by a dielectric stack including SiC 141 and silicon rich oxide (SRO) 142. Alternatively, the SRO 142 can be replaced or combined with Tetraethyl Orthosilicate (TEOS). In some embodiments, the BEVA 132 may include conductive materials such as metal. A lining layer 161 is lined over the BEVA 132 trench. A recap layer 134 is on the BEVA 132 and the lining layer 161. In some embodiments, the lining layer 161 is selected to be a seed layer of the material electroplated thereon. For example, if the material composing the BEVA includes copper, the lining layer 161 can be a seed layer of the electroplated copper. For example, the lining layer 161 may include TaN or Ta. The recap layer 134 may comprise TiN, TaN, W, Al, Ni, Co, Cu or the combination thereof. In some embodiments, a planarization operation, such as a CMP operation, may be applied to a top surface of the recap layer 134. In some embodiments, the material of the recap layer 134 is different from that of the BEVA 132. In some embodiments, the thickness of the recap layer 134 is in a range from about 100 Å about 400 Å. In some embodiments, the recap layer 134 extends to cover a top surface of the conductive materials of the BEVA 132, a top surface of the lining layer 161, and a portion of the dielectric layer 142 adjacent to the lining layer 161.

The bottom electrode 131 is on the recap layer 134. In some embodiments, the bottom electrode 131 may include nitrides such as TiN, TaN, Ta or Ru. The MTJ 135 is on the bottom electrode 131. As shown in FIG. 1A, a sidewall of the MTJ 135 is protected by a protection layer 127 such as a nitride layer. In some embodiments, the top surface of the MTJ 135 has a roughness in a range from about 2 Angstrom (Å) to about 10 Å, more particularly, from about 3 Å to about 5 Å. The roughness is defined by measuring height of each convex portions and depth of each concave portions of the top surface of the MTJ and then calculating a root mean square value of the height of each convex portions and the depth of each concave portions. In some embodiments, the measurement is performed by using microscopy, such as Atomic-force microscopy (AFM). The top layer 133 is disposed on the MTJ layer 135. In some embodiments, the top electrode 133 may include nitrides such as TiN, TaN, Ta or Ru. In some embodiments, the top electrode 133 and the bottom electrode 131 are made of a same material. In some embodiments, the material of the top electrode 133 is different from that of the BEVA 132.

In FIG. 1, the $(N+1)^{th}$ metal line 123' is surrounded by SiC 141 and SRO 143 in addition to the IMDs 125. In some embodiments, the protection layer 127 includes silicon nitrides. In some embodiments, a dielectric layer 129 can be disposed over the protection layer 127. In some embodiments, the SRO 143 can be disposed over the SiC 141, surrounding the $(N+1)^{th}$ metal line 123'.

In some embodiments, the BEVA 132 of the MRAM structure 130 is electrically coupled with the doped region. In some embodiments, the doped region is a drain 105 or a source 103. In other embodiments, the BEVA 132 of the MRAM structure 130 is electrically coupled with the gate 107. In some embodiments, the gate 107 of the semiconductor structure 10 can be a polysilicon gate or a metal gate.

Figure 1B:
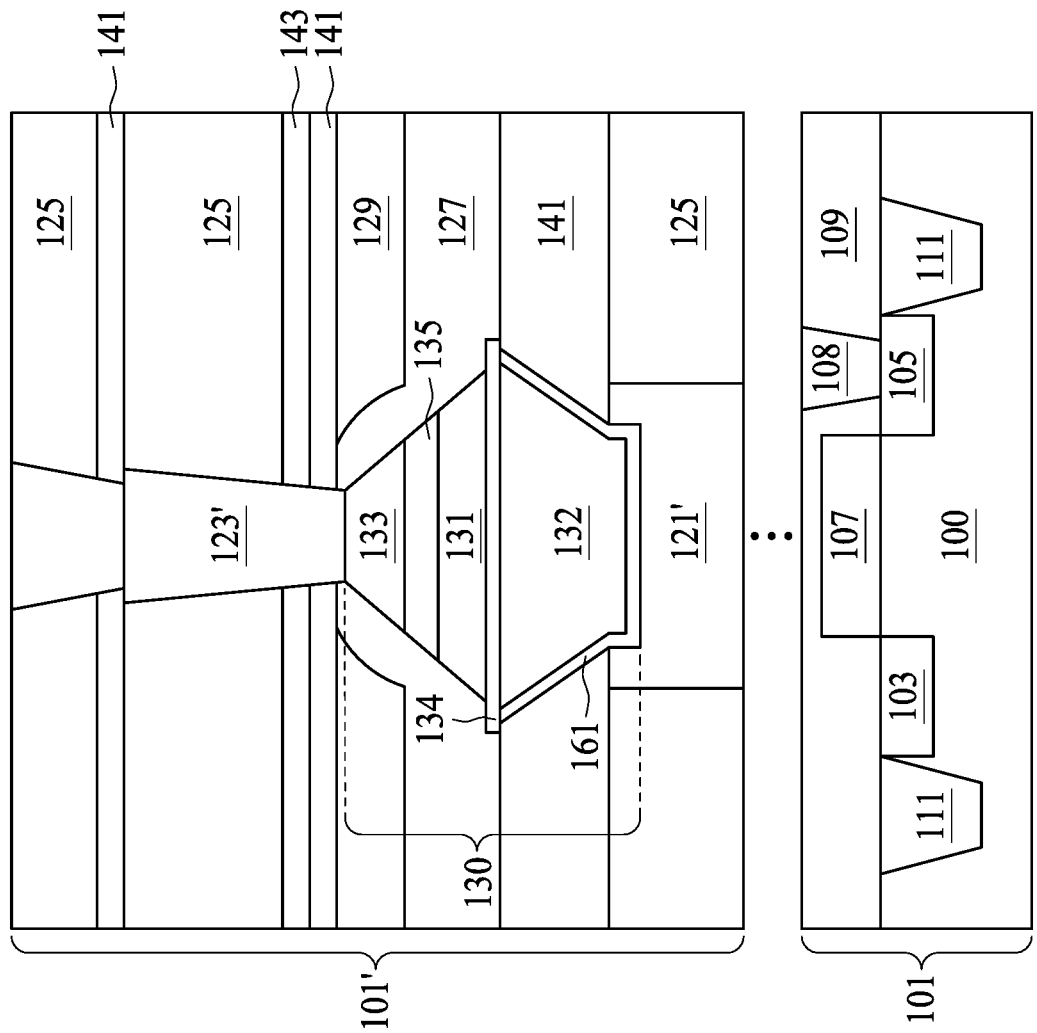
FIG. 1B is a cross section of a semiconductor structure, in accordance with some embodiments of the present disclosure.

Referring to FIG. 1B, the semiconductor structure 20 of FIG. 1B is similar to the semiconductor structure 10 in FIG. 1A except that the dielectric stack surrounding the BEVA 132 is a single layer. In some embodiments, the single layer can be an oxide layer, for example, a silicon-rich oxide (SRO) layer.

Figure 2:
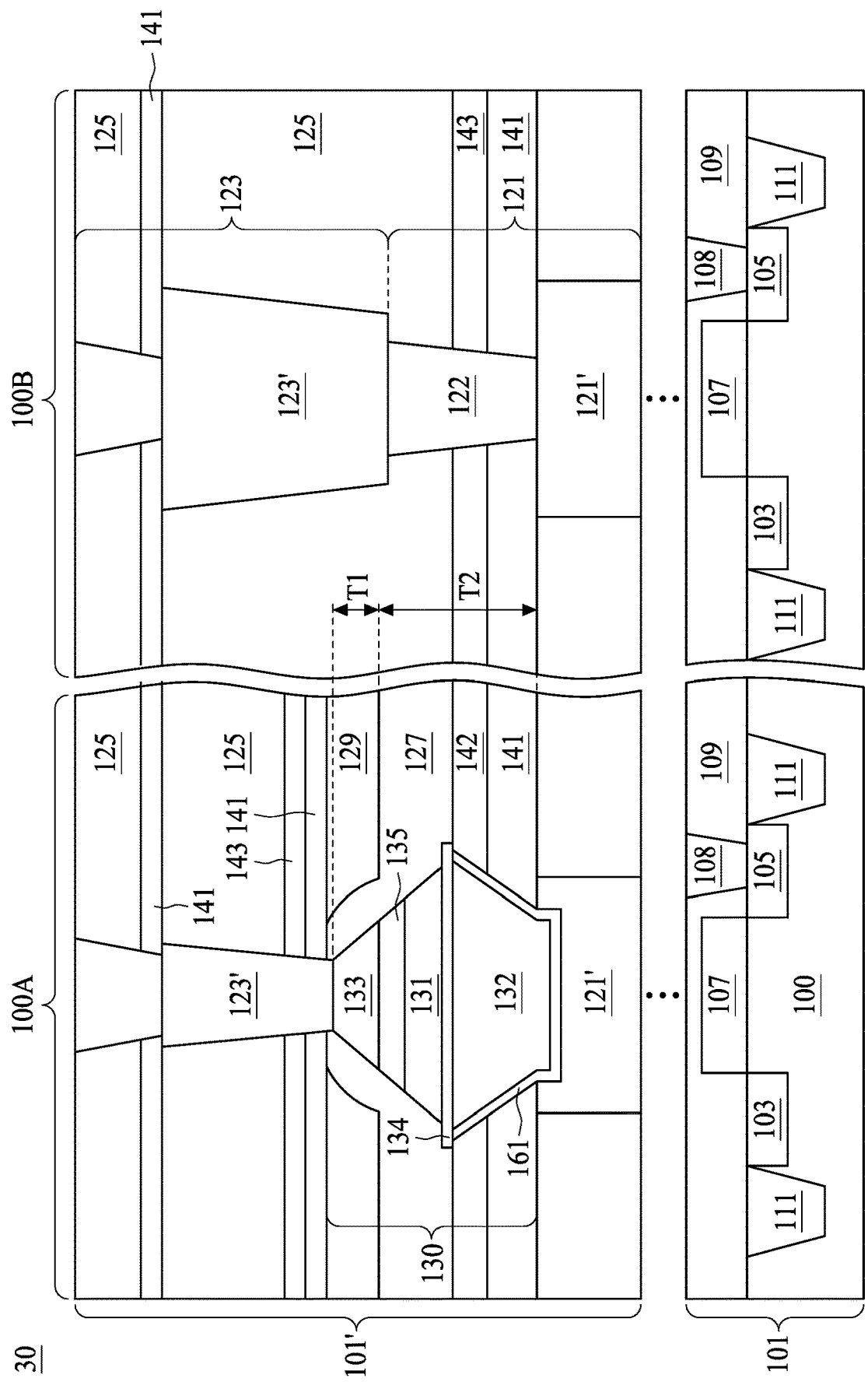
FIG. 2 is a cross section of a semiconductor structure, in accordance with some embodiments of the present disclosure.

Referring to FIG. 2, the semiconductor structure 30 can be a semiconductor circuit including a MRAM cell region 100A and a logic region 100B. Each of the MRAM cell region 100A and the logic region 100B has a transistor structure 101 in a semiconductor substrate 100. In some embodiments, the transistor structures 101 are substantially identical in the MRAM cell region 100A and in the logic region 100B. Details of the MRAM cell region 100A can be referred to the description of FIG. 1A and FIG. 1B. In the logic region 100B, the $N^{th}$ metal line 121' is connected to the $(N+1)^{th}$ metal line 123' by an $N^{th}$ metal via 122 of the $N^{th}$ metal layer 121. In some embodiments, the metal lines and metal vias are filled with electrically conductive material, e.g. copper, gold or another suitable metal or alloy, to form a number of conductive vias. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene operations. Metal lines and metal vias may be, or may not be, substantially free from aluminum. Comparing the MRAM cell region 100A and the logic region 100B, a thickness of the MRAM structure 130 is substantially equal to a sum of the thickness T2 of the $N^{th}$ metal via 122 and the thickness T1 of a portion of $(N+1)^{th}$ metal line 123'. In some embodiments, the metal line 123' may be the $(N+M)^{th}$ metal line, where M can be any integers greater than 1.

Figure 3:
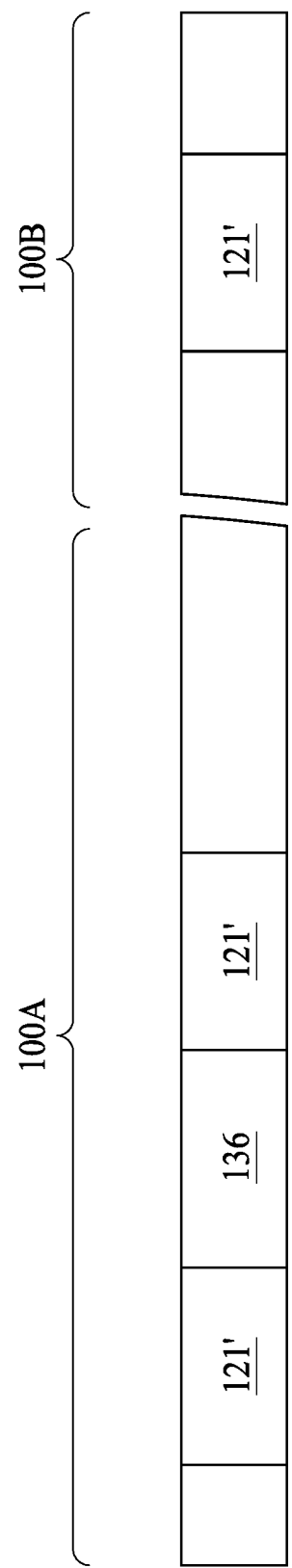
FIG. 3 is a cross section of a semiconductor structure fabricated at one operation, in accordance with some embodiments of the present disclosure.

FIG. 3 to FIG. 14 are cross-sectional views of a semiconductor structure fabricated at various stages, in accordance with some embodiments of the present disclosure. In FIG. 3, a semiconductor structure having a predetermined MRAM cell region 100A and a logic region 100B is provided. In some embodiments, a transistor structure is preformed in a semiconductor substrate (not shown in FIG. 3). The integrated circuit device may undergo further CMOS or MOS technology processing to form various features known in the art. For example, one or more contact plugs, such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) operation.

An $N^{th}$ metal line 121' is patterned in a dielectric layer 136 over the transistor structure. In some embodiments, the $N^{th}$ metal line 121' can be formed of an electroplating operation with a Cu seed layer deposited over the patterned dielectric layer 136. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 136.

Figure 4A:
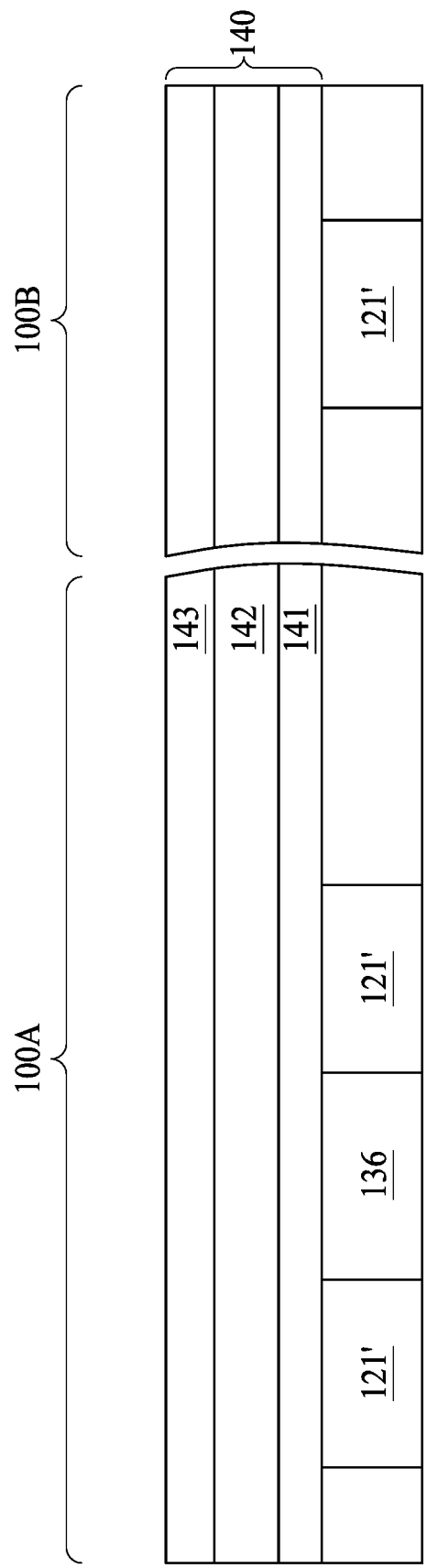

In FIG. 4A, a barrier layer 140 in a form of a dielectric stack including a SiC layer 141, a TEOS/SRO layer 142, and a SiC layer 141 are blanket deposited over a top surface of the $N^{th}$ metal line 121' and a top surface of the dielectric layer 136, in both the MRAM cell region 100A and the logic region 100B. The barrier layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 4B:
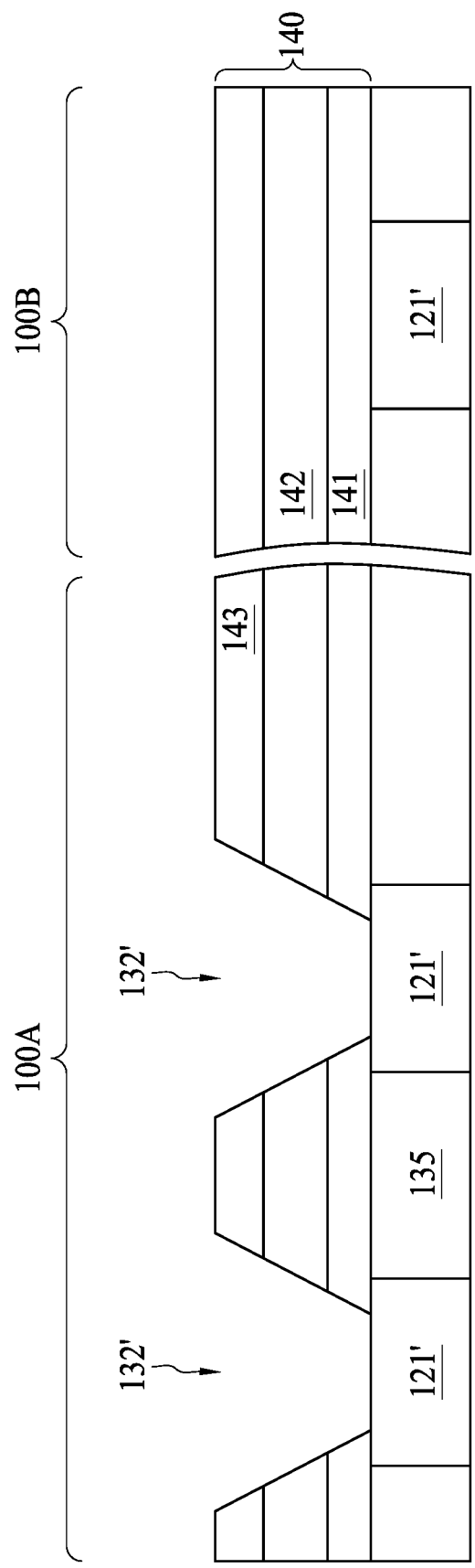

In FIG. 4B, a photoresist layer (not shown) is patterned over the barrier layer 140 to expose a BEVA hole 132' of the MRAM structure. As shown in FIG. 4B, two BEVA hole 132' is formed in the barrier layer 140 by a suitable dry etch operation. In some embodiments, the dry etch in the present operation includes reactive ion etch (RIE) adopting fluorine-containing gases. In some embodiments, the present dry etch operation can be any suitable dielectric etch to form via trenches in a metallization structure of conventional CMOS technology. Referring to the logic region 100B as shown in FIG. 4B, the barrier layer 140 is protected by the photoresist layer (not shown) such that a top surface of the $N^{th}$ metal layer 121' is not exposed as opposed to the counterpart in the MRAM cell region 100A.

Figure 4C:
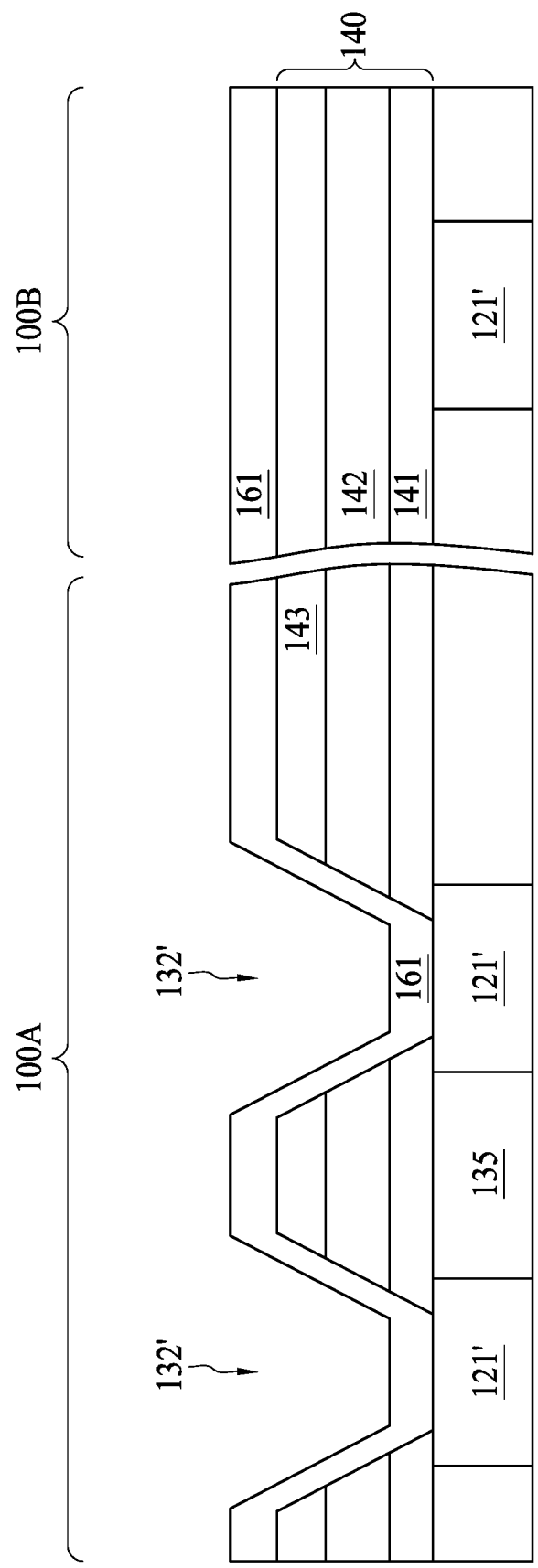
Figure 4D:
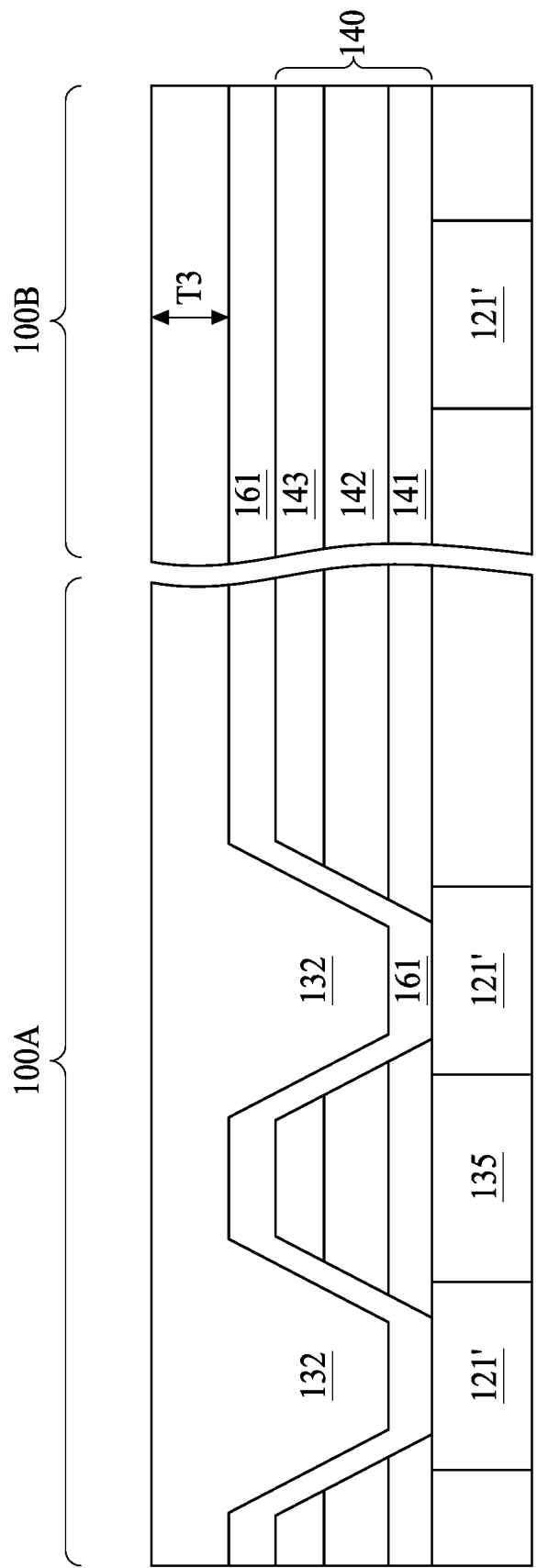

In FIG. 4C, a lining layer 161 is blanket lined over the BEVA hole 132' in the MRAM cell region 100A and over the barrier layer 140 in the logic region 100B. Subsequently, a deposition of BEVA material 132 is conducted to be disposed over the lining layer 161 and the barrier layer 140. The BEVA material 132 may comprise conductive materials such as metal. In some embodiments, the BEVA material 132 can be electroplated copper. In some embodiments, a overfilling of the BEVA material 132 is carried out in the electroplating operation. For example, a thickness T3 of from about 50 nm to about 800 nm is adopted to overfill the BEVA hole. Note the thickness T3 is determined in consideration to minimize the dimple effect of the electroplating. Due to the existence of the BEVA hole 132, the thickness T3 of the overfill is required to be more than about 50 nm in order to effectively minimize the dimple which may occur over the BEVA hole 132 after the electroplating operation.

Figure 4E:
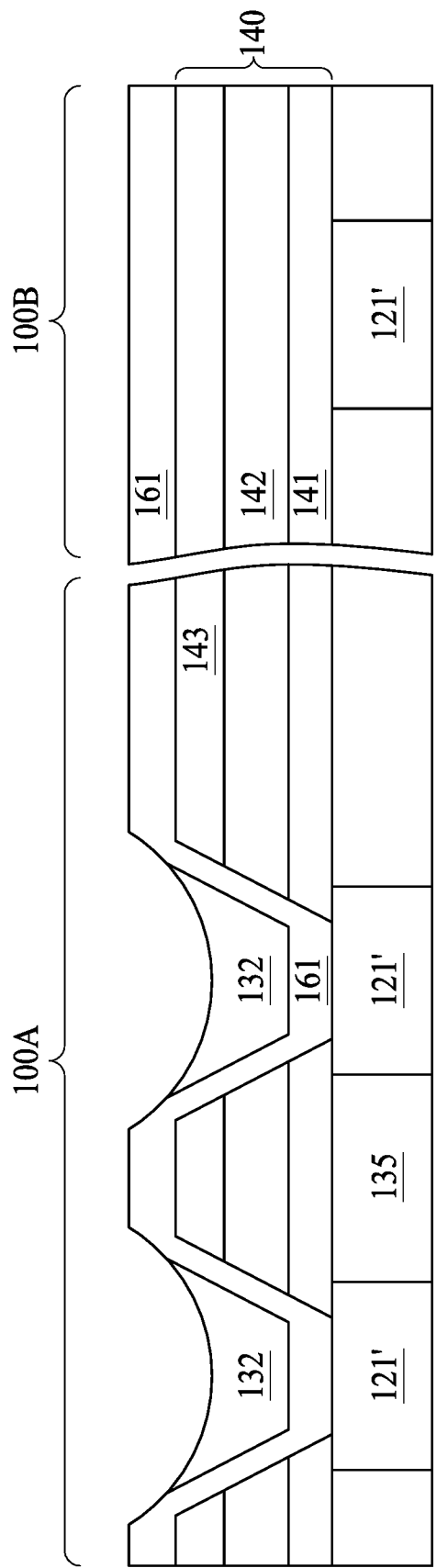
Figure 4F:
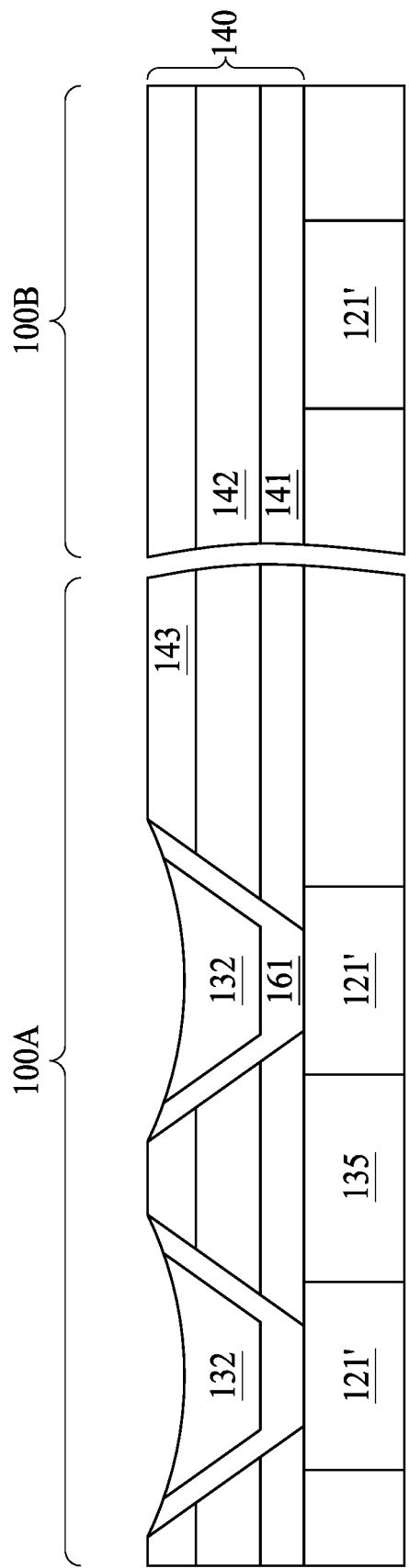

In FIG. 4E, the lining layer 161 and the deposited BEVA material 132 is then etched back to level with a top surface of the barrier layer 140. Subsequently, a finer planarization operation such as a multi-step CMP is carried out to form a flat copper surface of the BEVA 132. In FIG. 4E to FIG. 4G, a three-step CMP is adopted with slurries of different selectivity to achieve a flat copper surface. In FIG. 4E, a first selective removal includes utilizing a first slurry having a higher selectivity to copper than to the lining layer 161. In some embodiments, the first slurry includes $H_2O_2$, Benzotriazole (BTA), carboxylic acid, and abrasives. The first slurry consumes copper faster than the lining layer 161, rendering a dishing over the copper filling of the BEVA 132, as shown in FIG. 4E.

In FIG. 4F, a second selective removal includes utilizing a second slurry having a higher selectivity to the lining layer 161 than to copper. In some embodiments, the second slurry includes $H_2O_2$, Benzotriazole (BTA), pH adjustor, carboxylic acid, and abrasives. The second slurry consumes the lining layer 161 faster than copper, rendering a removal of the lining layer 161 without consuming much of the exposed copper.

In FIG. 4G, a third selective removal includes utilizing a third slurry having a higher selectivity to the lining layer 161 than to copper. In some embodiments, the third slurry includes $H_2O_2$, inhibitor, pH adjustor, carboxylic acid, and abrasives. The third slurry consumes one of the dielectric stacks faster than copper, for example, rendering a removal of the SiC 141 without consuming much of the exposed copper.

From FIG. 4E to FIG. 4G, the dishing of the copper resulted in the first selective removal is compensated by the second and the third selective removals, where other materials surrounding the dishing copper surface are removed faster than copper. In FIG. 4G, the dishing effect of the cooper surface after the CMP is effectively alleviated.

Figure 4H:
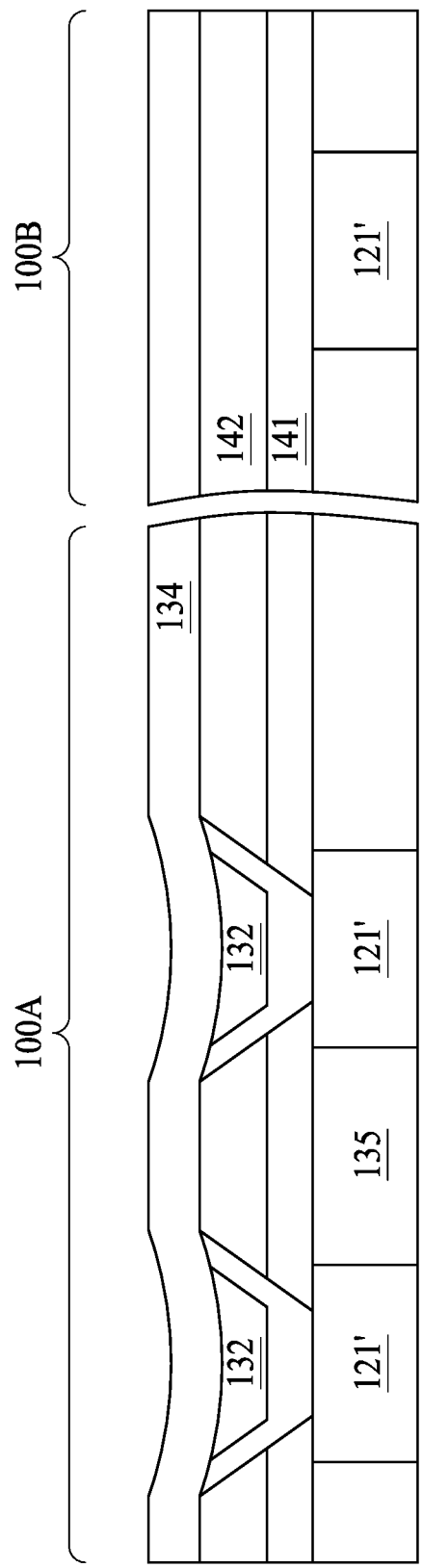
Figure 4I:
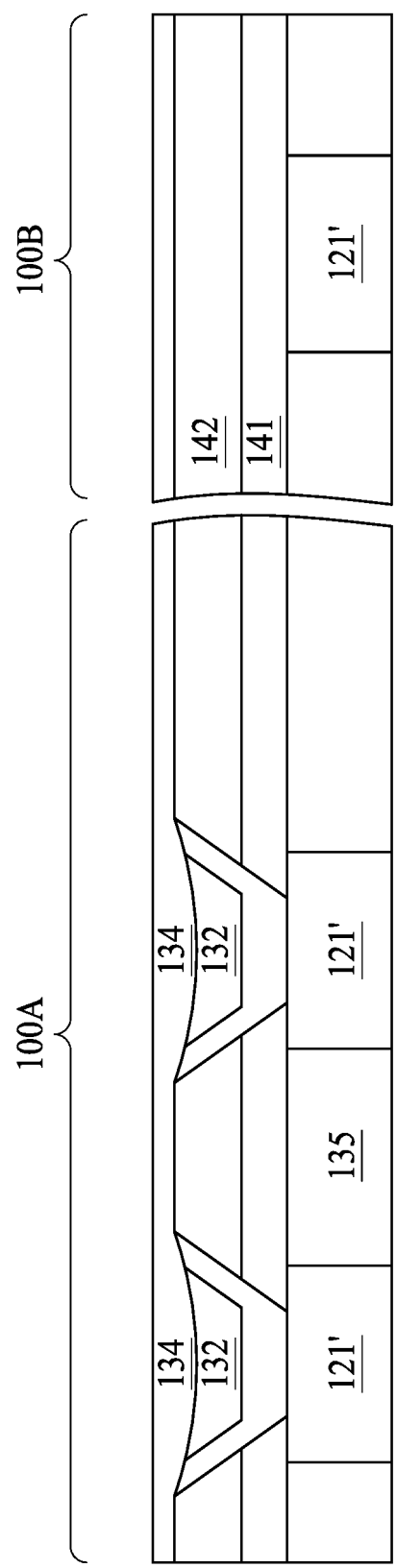

Referring to FIG. 4H, a recap layer 134 is blanket formed over the deposited BEVA material 132 and the barrier layer 140. The deposited recap layer 134 may comprise TiN, TaN, W, Al, Ni, Co, Cu or the combination thereof. In some embodiments, the recap layer 134 can be deposited to a predetermined thickness by an atomic layer deposition (ALD) operation. Alternatively, the recap layer 134 can be deposited to a thickness by a chemical vapor deposition (CVD) operation and then be planarized by a CMP operation to a predetermined thickness, as shown in FIG. 4I. As previously discussed, the as-deposited recap layer 134 thickens is determined by minimizing the dimple over the BEVA materials due to the slight dishing. In some embodiments, the thickness of the recap layer after the CMP may be in a range from about 20 Å to about 50 Å.

Figure 4J:
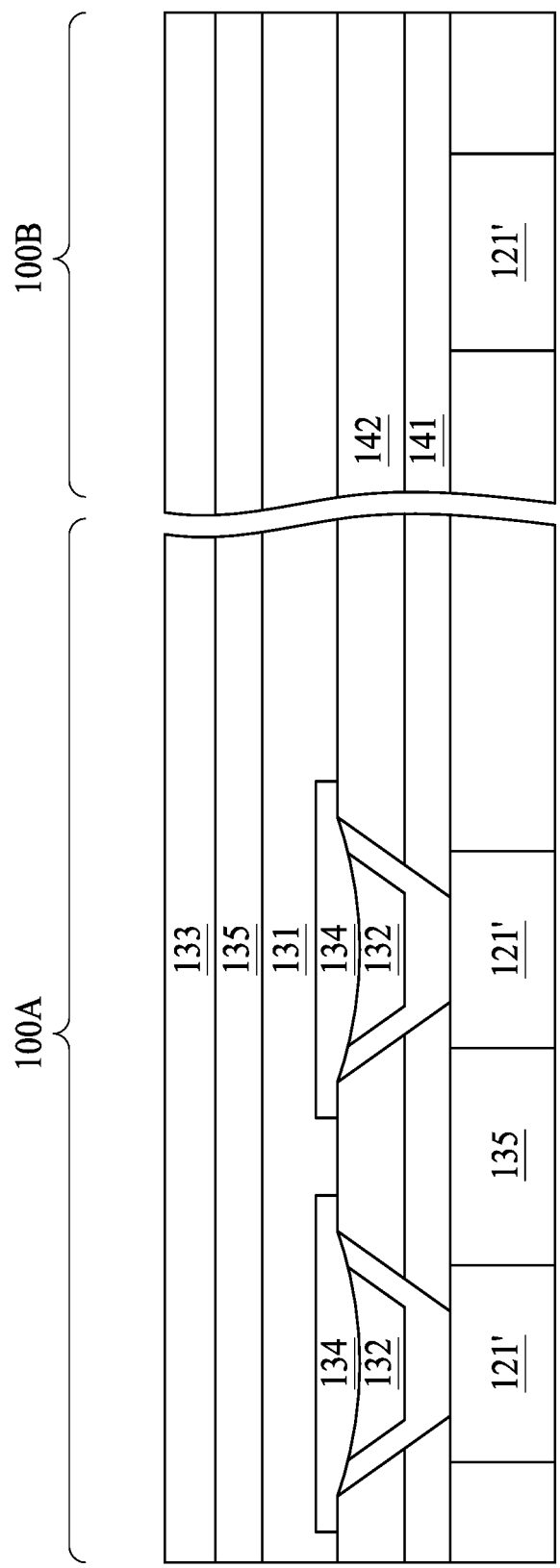

In FIG. 4J, the recap layer 134 is patterned to cover the copper surface and the lining layer 161 surface of the BEVA, as well as a portion of the dielectric layer (141, 142) in proximity to the BEVA. The recap layer 134 is so covered as to eliminate the stair heights at heteroboundaries between the aforesaid three materials, namely, for example, copper, TaN or Ta, SRO or TEOS. Because the CMP slurry previously used may possess different removal rates to those three materials, the formation of the recap layer is to provide a unified flat surface compensating the different stair heights among heteroboundaries. Hence, the recap layer 134 shall at least cover the aforesaid two heteroboundaries, one between copper and lining layer 161, one between the lining layer 161 and dielectric layer, for example, SRO 142.

In FIG. 4J, a bottom electrode 131 is deposited on the recap layer 134. The bottom electrode 131 may comprise TiN, TaN, Ta or Ru. The deposited bottom electrode 131 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Then, an MTJ 135 is deposited in a form of multiple material stacks (not illustrated in FIG. 4J) over the bottom electrode 131. In some embodiments, the MTJ 135 has a thickness in a range from about 150 Å to about 250 Å. In some embodiments, the top surface of the MTJ 135 has a roughness of about 2 Å if the recap layer 134 and the underlying copper have been performed by the CMP operation. In some embodiments, the top surface of the MTJ 135 has a roughness of about 10 Å if the recap layer 134 has not been performed by the CMP operation. The MTJ 135 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ 135 may include an antiferromagnetic layer in accordance with other embodiments.

Following the formation of the MTJ 135, a top electrode 133 is deposited over the MTJ 135. The top electrode 133 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode 133 comprises TiN, TaN, Ta or Ru.

Figure 4K:
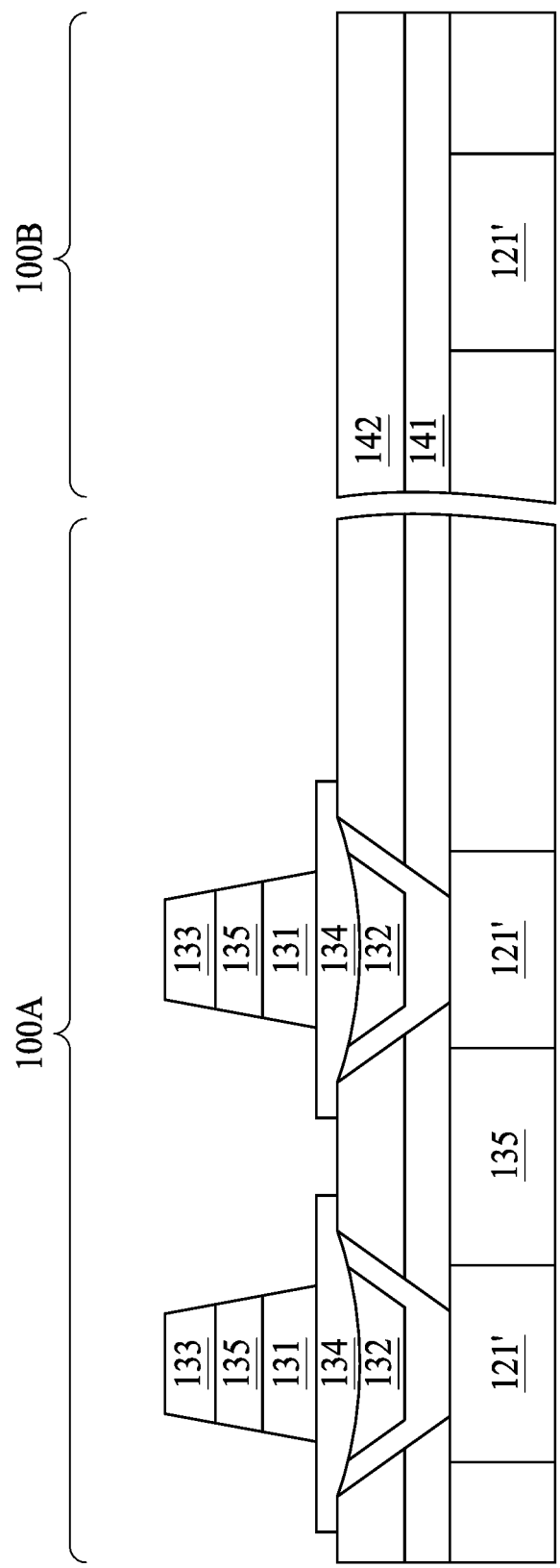

Referring to FIG. 4K, a mask layer (not shown) is formed over the top electrode 133 for the ensuing MRAM structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ 135, the top electrode 133, the bottom electrode 131 and the recap layer 134. In some embodiments, the MTJ 135 and the top electrode 133 are formed by an RIE to have a trapezoidal shape viewing from a cross section.

Figure 5A:
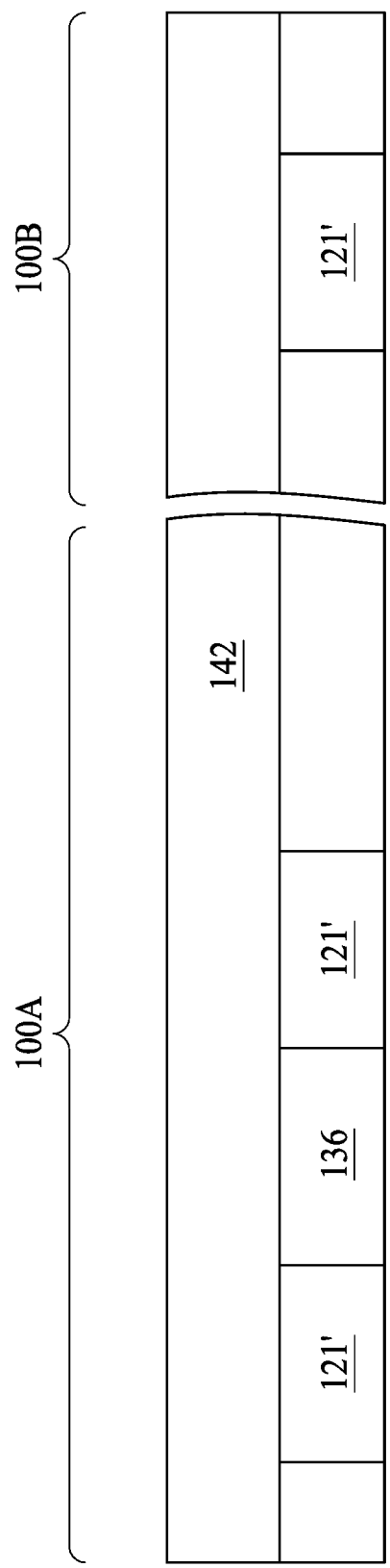
FIG. 5A to FIG. 5E are cross sections of a second semiconductor structure fabricated at various operations, in accordance with some embodiments of the present disclosure.
Figure 5B:
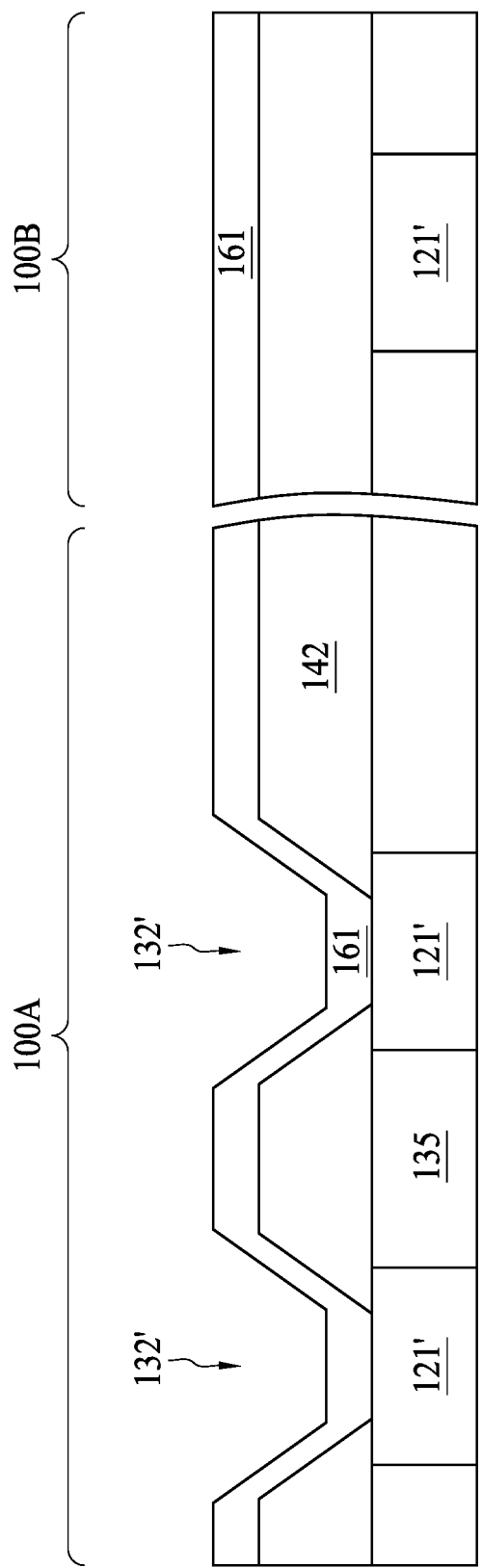
Figure 5C:
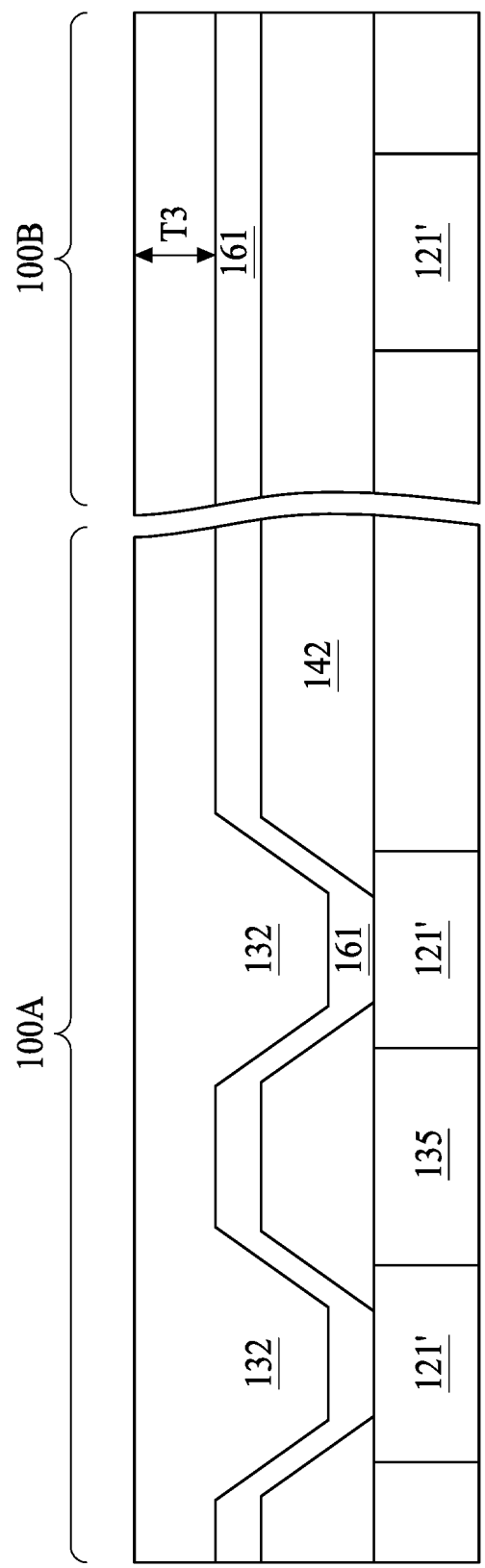

Detailed description of FIG. 5A and FIG. 5C can be referred to those previously addressed in FIG. 4A to FIG. 4C. Note in FIG. 5A and FIG. 5B, the dielectric layer surrounding the BEVA hole 132' is a single dielectric layer. In some embodiments, the single dielectric layer includes oxides, for example, SRO.

Figure 5D:
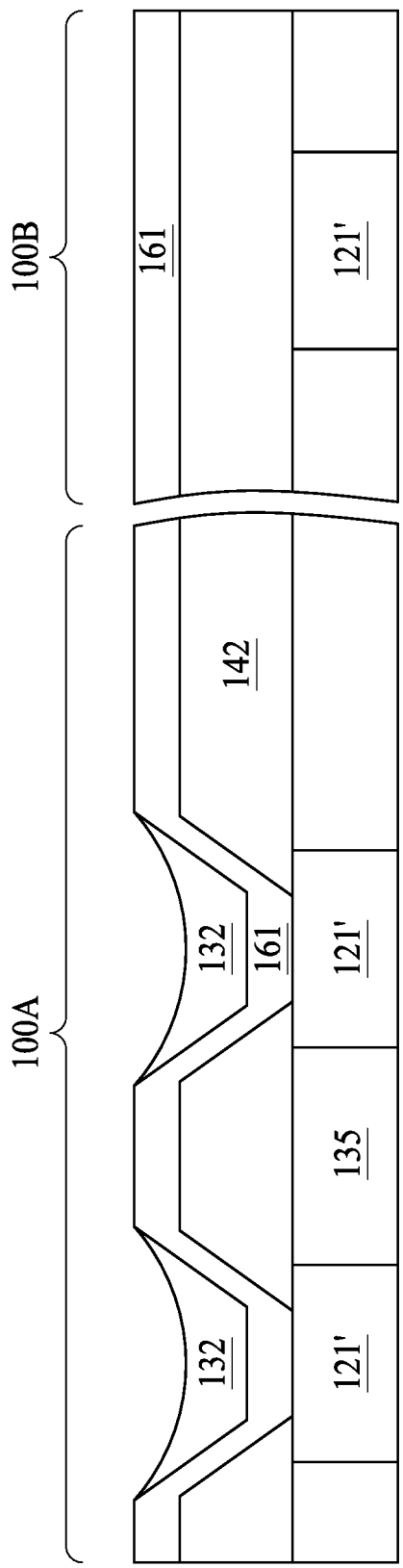
Figure 5E:
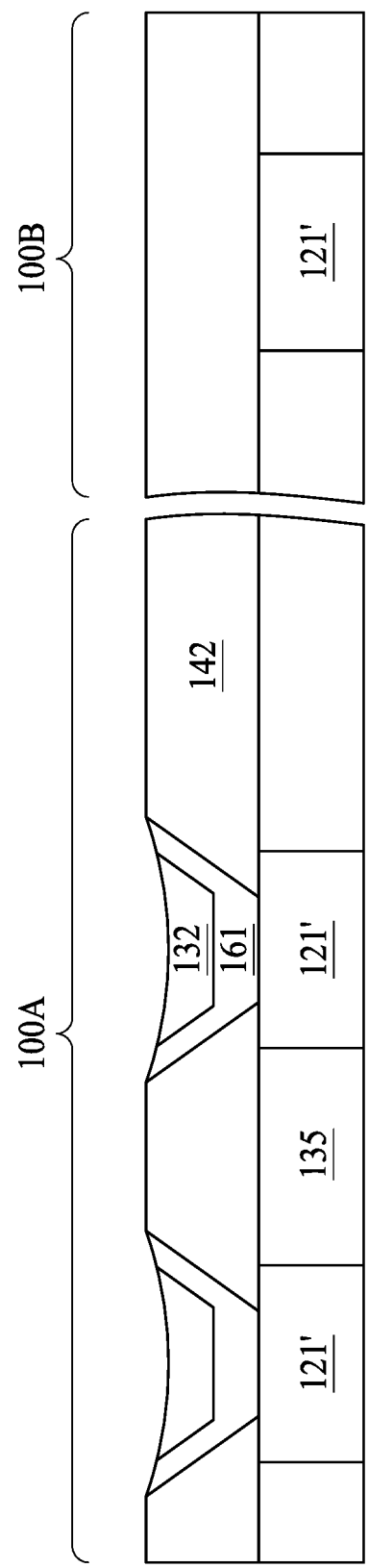

In FIG. 5D to FIG. 5E, a two-step CMP is adopted with slurries of different selectivity to achieve a flat copper surface. In FIG. 5D, a first selective removal includes utilizing a first slurry having a higher selectivity to copper than to the lining layer 161. In some embodiments, the first slurry includes $H_2O_2$, Benzotriazole (BTA), carboxylic acid, and abrasives. The first slurry consumes copper faster than the lining layer 161, rendering a dishing over the copper filling of the BEVA 132, as shown in FIG. 5D.

In FIG. 5E, a second selective removal includes utilizing a second slurry having a higher selectivity to the lining layer 161 than to copper. In some embodiments, the second slurry includes $H_2O_2$, inhibitor, pH adjustor, carboxylic acid, and abrasives. The second slurry consumes the lining layer 161 faster than copper, rendering a removal of the lining layer 161 without consuming much of the exposed copper.

From FIG. 5D to FIG. 5E, the dishing of the copper resulted in the first selective removal is compensated by the second selective removals, where other materials surrounding the dishing copper surface are removed faster than copper. In FIG. 5E, the dishing effect of the cooper surface after the CMP is effectively alleviated.

Figure 6:
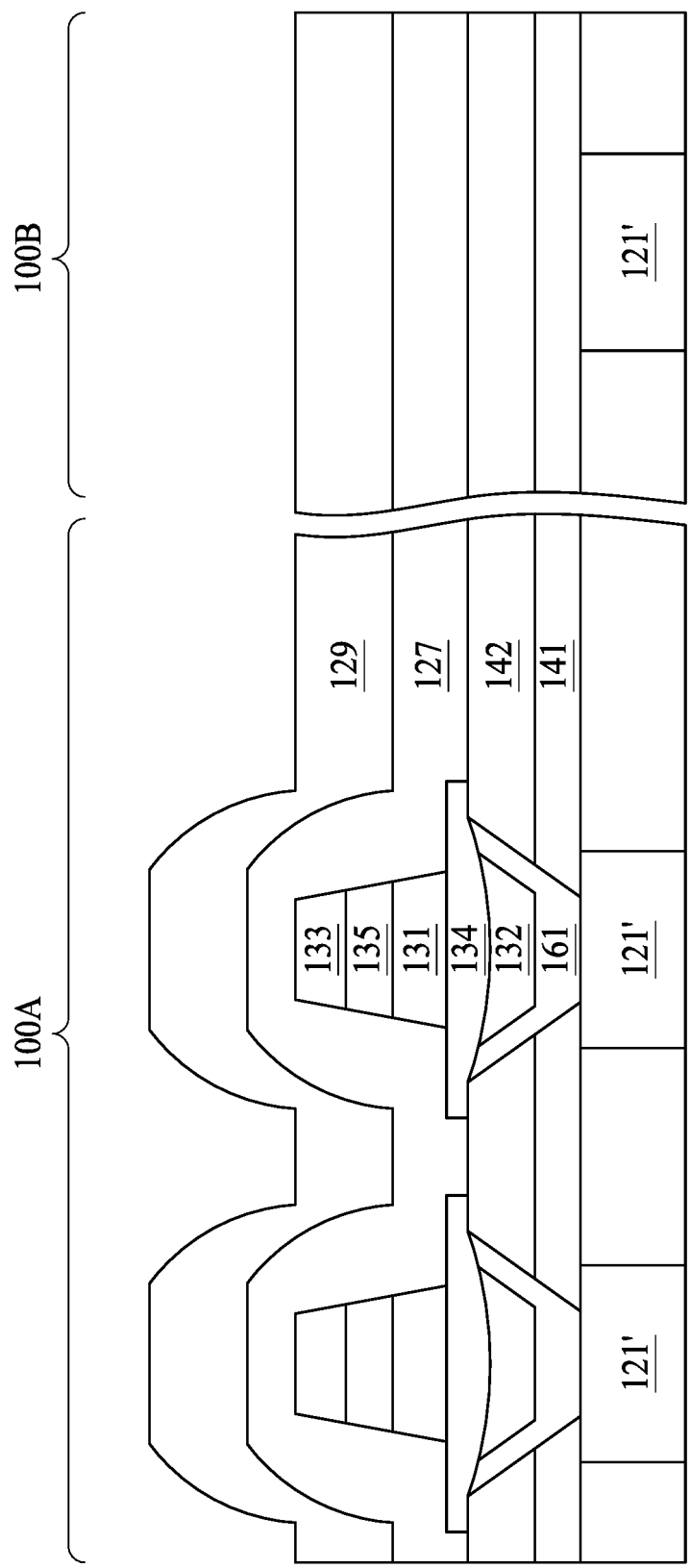
FIG. 6 to FIG. 14 are cross sections of the first semiconductor structure fabricated at various operations following FIG. 4A to FIG. 4K, in accordance with some embodiments of the present disclosure.

Referring to FIG. 6, FIG. 6 shows a protection layer 127 conformally formed over the MTJ 135 and the top electrode 133 following the semiconductor structure of FIG. 4K. In some embodiments, the protection layer 127 possesses a thickness of from about 50 Å to about 300 Å. Note a sidewall of the MTJ 135 and the sidewall of the bottom electrode 131 are surrounded by the protection layer 127 to prevent oxidation or other contamination. Subsequently, a dielectric layer 129 such as an STO is conformally deposited over the protection layer 127. In some embodiments, a thickness of the dielectric layer 129 is to be determined according to a level of a top surface thereof relative to the top surface of the top electrode 133. For example, a top surface of the dielectric layer 129 at the logic region 100B is to be greater than or about equal to a top surface of the top electrode 133 of an MRAM structure.

Figure 7:
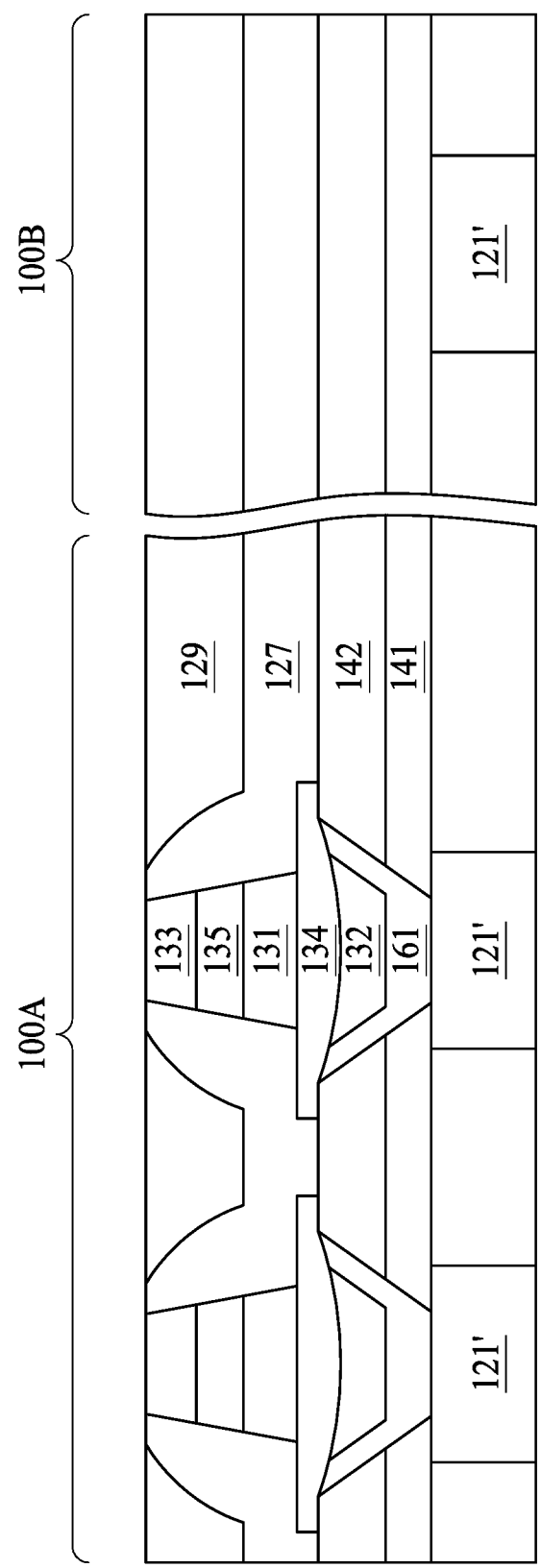
Figure 10:
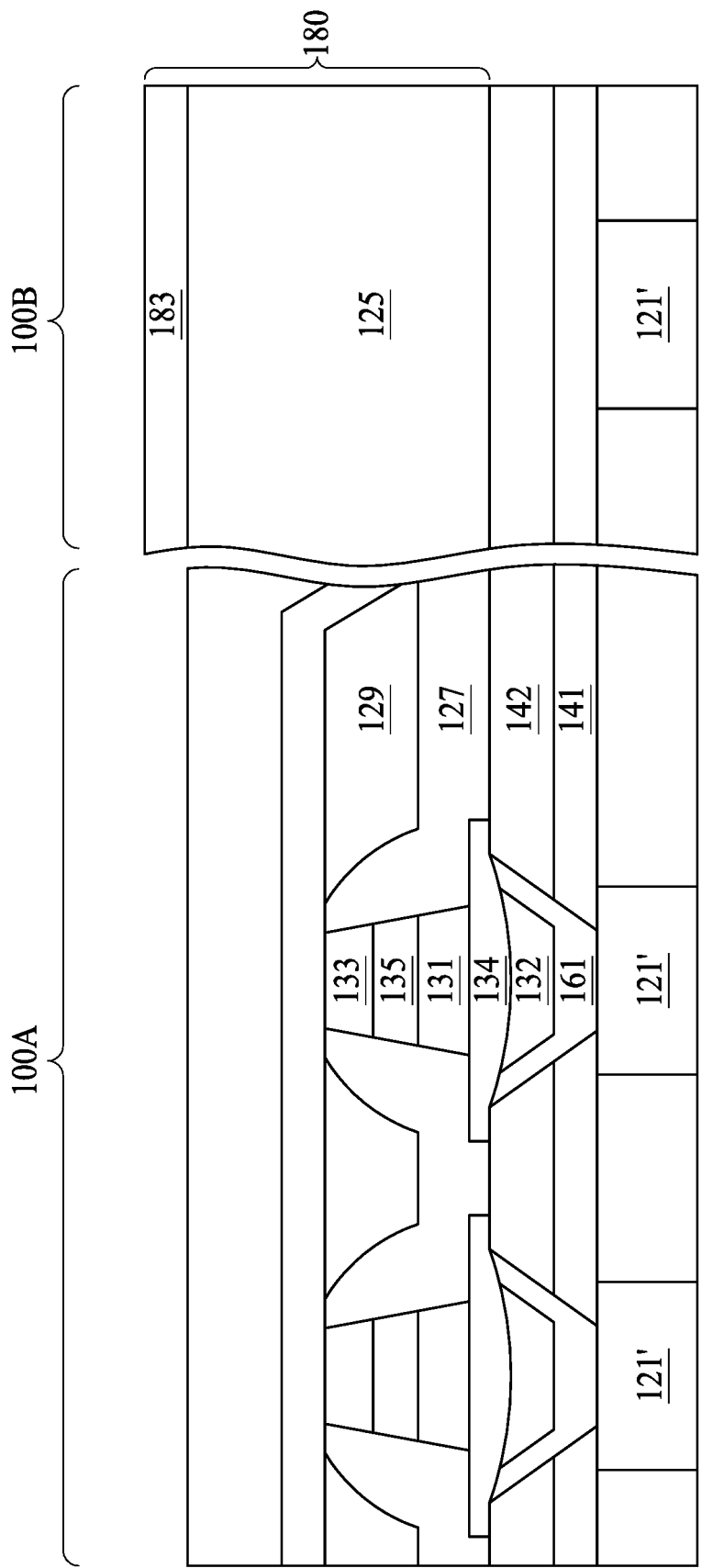

In FIG. 7, a planarization operation is performed on the dielectric layer 129 such that the top surface of the dielectric layer 129 is substantially flat across the MRAM cell region 100A and the logic region 100B. As shown in FIG. 10, the top surface of the top electrode 133 is exposed from the dielectric layer 129 after the planarization operation. Note the top surface of the top electrode 133 shall be composed of TiN or TaN no matter the top electrode is a single or a composite layer.

Figure 8:
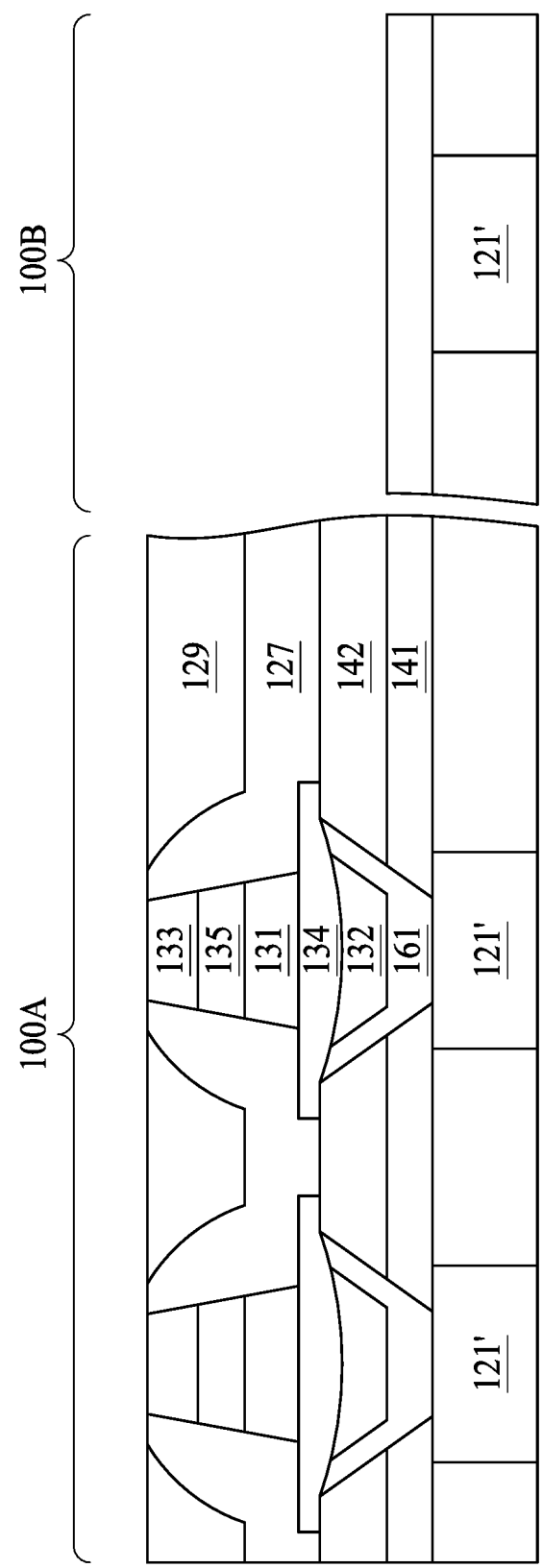
Figure 9:
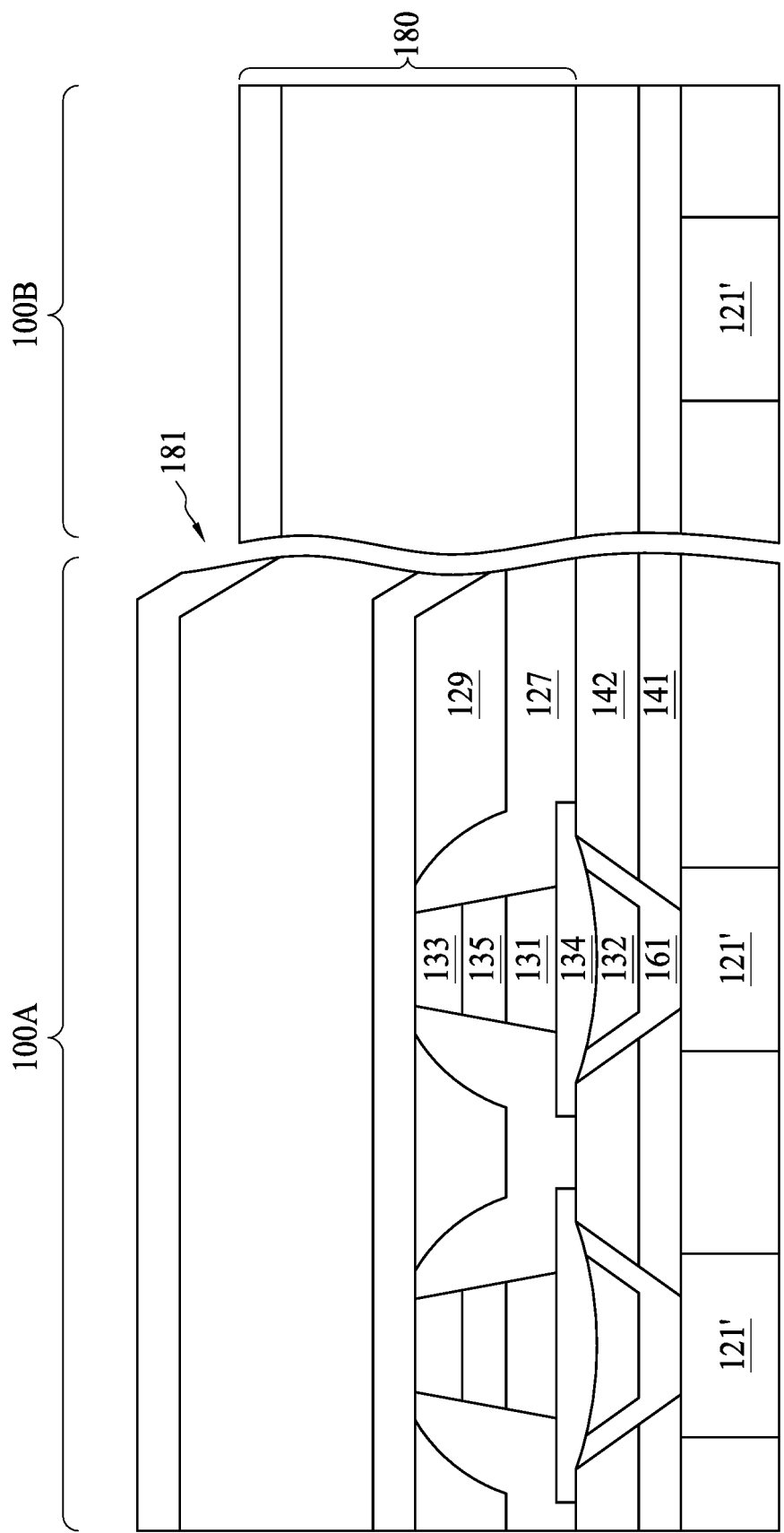

In FIG. 8 to FIG. 10, an upper portion of the barrier layer 140, the protection layer 127, and the dielectric layer 129 are removed from the logic region 100B by an etch back operation, as illustrated in FIG. 8. Hence, the MRAM cell region 100A is in greater height than the logic region 100B. In FIG. 9, a dielectric layer-low k-dielectric layer composite 180 is formed to conformally cover the MRAM cell region 100A and the logic region 100B. A step difference 181 can be observed in FIG. 9, therefore, an etch back operation as illustrated in FIG. 10 is performed to obtain a substantially flat top surface for the following trench formation in both the MRAM cell region 100A and the logic region 100B. Note a dielectric layer 183 of the dielectric layer-low k-dielectric layer composite 180 is remained virtually in the logic region 100B after the aforesaid planarization operation. The dielectric layer 183 is deliberately kept to act as a protection layer for the subsequent trench formation. The dielectric layer 183 can prevent the acidic solution from damaging the low k dielectric layer during a photoresist stripping operation.

Figure 11:
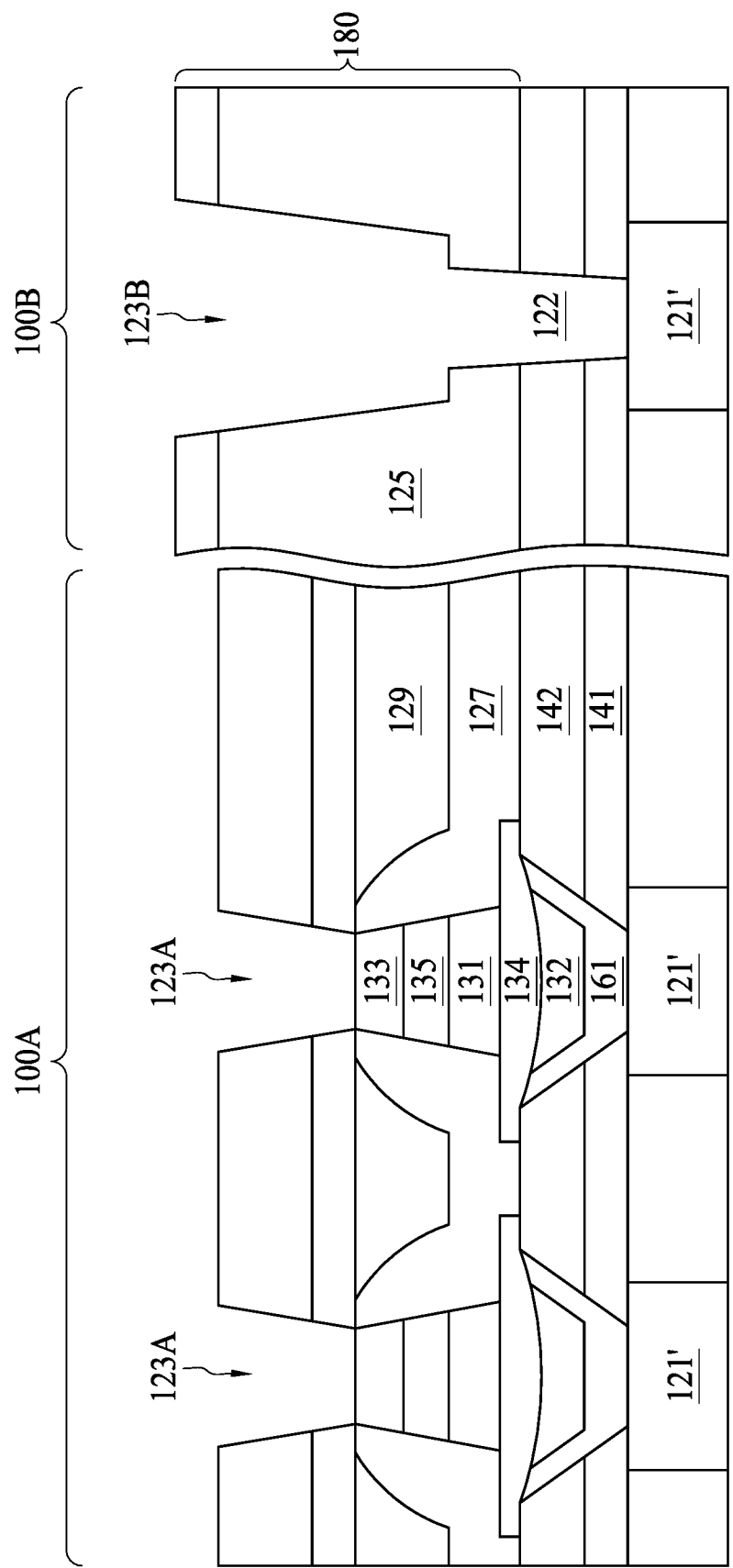

In FIG. 11, photoresist (not shown) is patterned over the planarized dielectric surface to form trenches for metal lines and metal via. For example, in the MRAM cell region 100A, a $(N+1)^{th}$ metal line trench 123A is formed over the MRAM structure 130, exposing a top surface of the top electrode 133 of the MRAM structure 130. In the logic region 100B, an $N^{th}$ metal via trench and an $(N+1)^{th}$ metal line trench (combinatory 123B) is formed over the Nth metal line 121', exposing a top surface of the $N^{th}$ metal line 121'.

Figure 12:
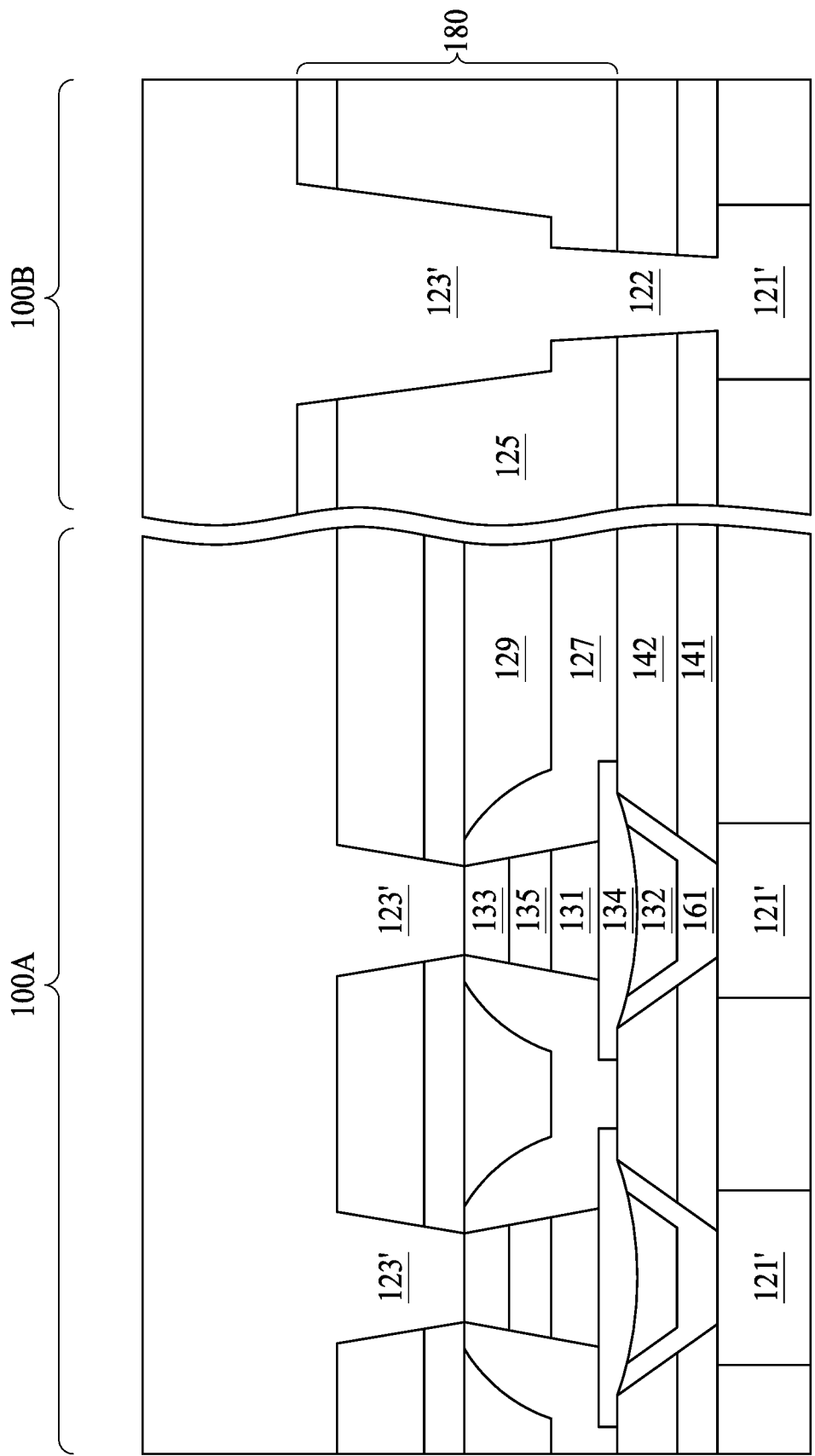
Figure 13:
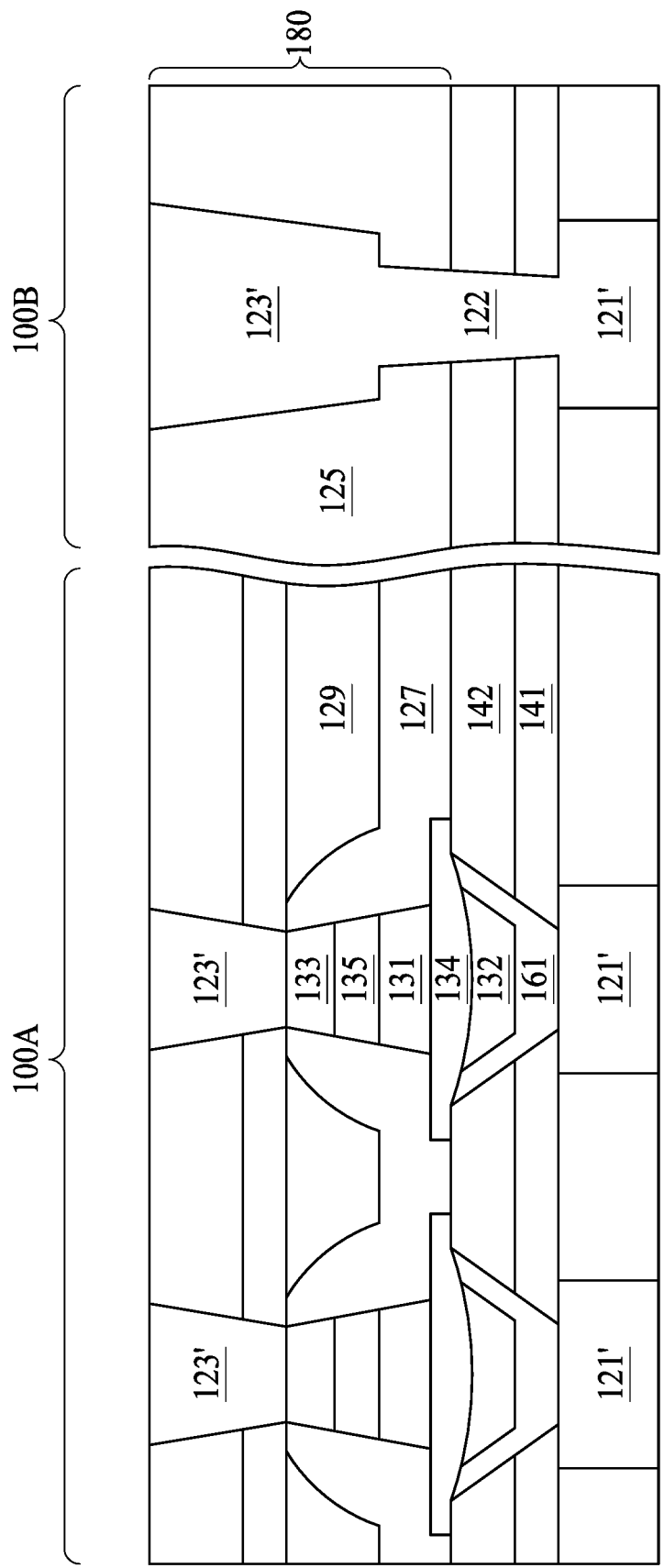

In FIG. 12 and FIG. 13, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. $(N+1)^{th}$ metal line 123' may be formed from W, and more preferably from copper (Cu), including AlCu (collectively, Cu). In one embodiment, $(N+1)^{th}$ metal lines 123' are formed using the Damascene operation, which should be familiar to those in the art. First, trenches are etched through the low k dielectric layer. This operation can be performed by plasma etch operation, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by plasma deposition operation, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

Figure 14:
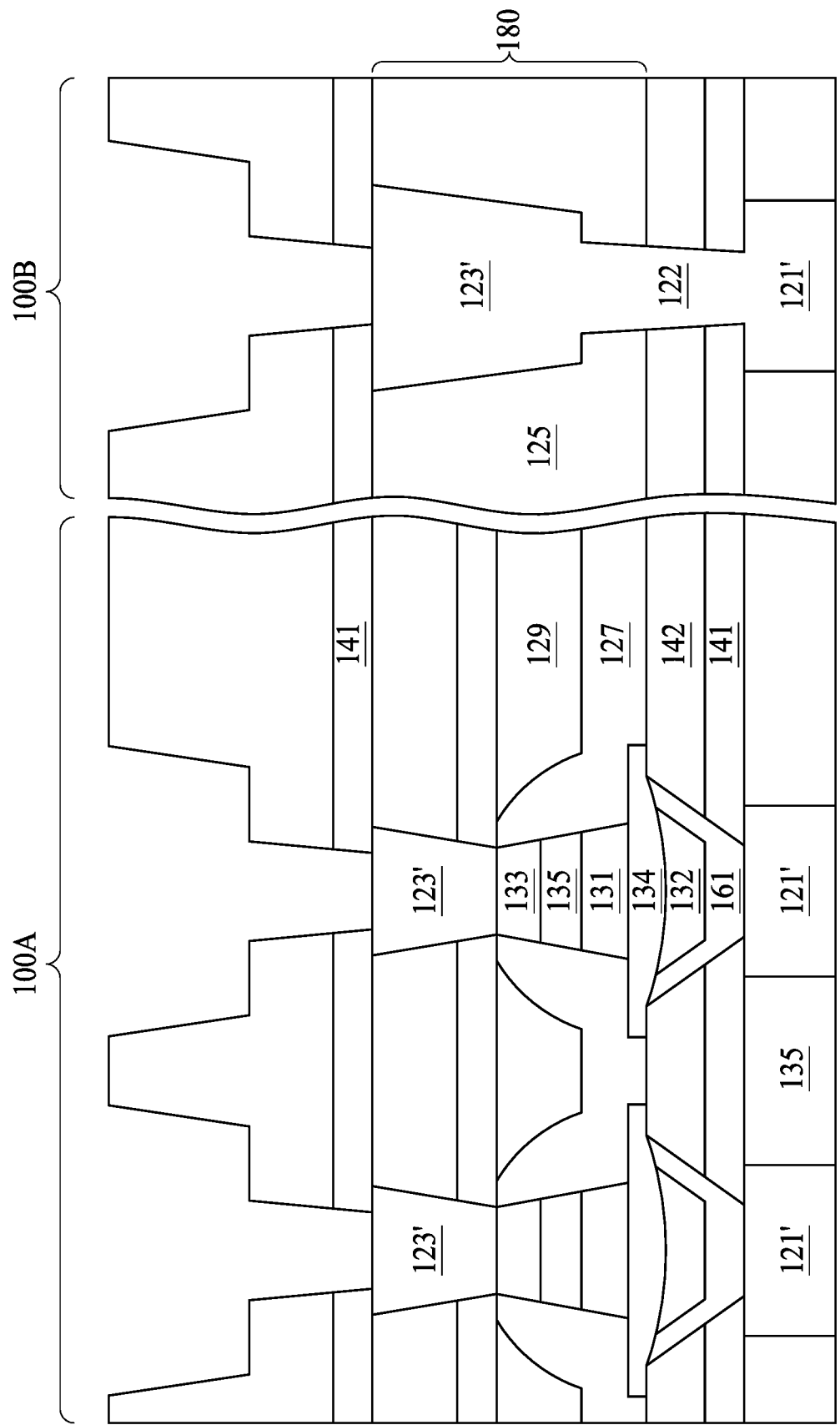

After the planarization operation removing the overburden of the conductive metal as illustrated in FIG. 13, an $(N+1)^{th}$ metal line 123' in both the MRAM cell region 100A and the logic region 100B, as well as an $N^{th}$ metal via 122 in the logic region 100B, are formed. In FIG. 14, a subsequent barrier layer 141 and $(N+1)^{th}$ metal via trench as well as $(N+2)^{th}$ metal line trench are formed in the low k dielectric layer. Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene operation is used to form a copper related multilayer interconnection structure.

Some embodiments of the present disclosure provide a semiconductor structure. The semiconductor structure includes a bottom electrode via (BEVA), a recap layer on the BEVA, and a magnetic tunneling junction (MTJ) layer over the recap layer. The BEVA includes a lining layer over a bottom and a sidewall of a trench of the BEVA, and electroplated copper over the lining layer, filling the trench of the BEVA. The recap layer overlaps a top surface of the lining layer and a top surface of the electroplated copper.

Some embodiments of the present disclosure provide a semiconductor structure. The semiconductor structure includes a logic region a memory region. The memory region includes an $N^{th}$ metal layer, an $(N+M)^{th}$ metal layer over the $N^{th}$ metal layer, N and M being positive integers, and a magnetic random access memory (MRAM) structure between the $N^{th}$ metal layer and the $(N+M)^{th}$ metal layer. The MRAM structure includes copper.

Some embodiments of the present disclosure provide a method for manufacturing a semiconductor structure. The method includes forming a bottom electrode via (BEVA)

trench in a dielectric layer, forming a lining layer over the BEVA hole, electroplating copper on the lining layer and filling the BEVA hole, performing a first planarization over the copper, and forming a magnetic tunneling junction (MTJ) layer over the copper.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a bottom electrode via (BEVA) in a dielectric layer, comprising:
      a lining layer over a bottom and a sidewall of a trench of the BEVA; and
      a copper layer over the lining layer, filling the trench of the BEVA;
   a recap layer on the BEVA; and
   a bottom electrode on the recap layer;
   a magnetic tunneling junction (MTJ) layer over the recap layer and vertically aligning with the BEVA;
   wherein the copper layer and the lining layer jointly have a dimpled structure with a top surface lower than a top surface of the dielectric layer, and the recap layer overlaps a top surface of the lining layer, an entire top surface of the copper layer, and a portion of the dielectric layer adjacent to the lining layer.

2. The semiconductor structure of claim 1, wherein the lining layer having a top surface lower than a top surface of the dielectric layer.

3. The semiconductor structure of claim 1, wherein the lining layer having a top surface higher than the top surface of the copper layer.

4. The semiconductor structure of claim 1, wherein the recap layer having a bottom surface lower than the top surface of the dielectric layer.

5. The semiconductor structure of claim 1, wherein the thickness of the recap layer is in a range from about 20 Å to about 50 Å.

6. The semiconductor structure of claim 1, wherein a portion of the recap layer is concaved toward the copper layer.

7. The semiconductor structure of claim 1, wherein a top surface of the recap layer is a substantially flat surface.

8. The semiconductor structure of claim 1, wherein a bottom surface of the recap layer is nonplanar.

9. A semiconductor structure, comprising:
   a logic region, comprising an $N^{th}$ metal layer; and
   a memory region, comprising:
      an $N^{th}$ metal layer;
      an $(N+M)^{th}$ metal layer over the $N^{th}$ metal layer, N and M being positive integers; and
      a magnetic random access memory (MRAM) structure between the $N^{th}$ metal layer and the $(N+M)^{th}$ metal layer,
      wherein the MRAM structure comprises:
         a bottom electrode via (BEVA) having a lining layer and a conductive layer surrounded by a dielectric layer, and the lining layer and the conductive layer jointly having a dimpled structure with a top surface lower than a top surface of the dielectric layer;
         a recap layer contacting an entire top surface of the lining layer, an entire top surface of the conductive layer, and a portion of the dielectric layer adjacent to the lining layer;
   wherein the $N^{th}$ metal layer of the logic region and the $N^{th}$ metal layer of the memory region are laterally aligned.

10. The semiconductor structure of claim 9, wherein the dielectric layer comprises a dielectric stack.

11. The semiconductor structure of claim 10, wherein the dielectric stack comprises a lower layer and an upper layer.

12. The semiconductor structure of claim 11, wherein the material of the upper layer is silicon rich oxide (SRO), Tetraethyl Orthosilicate (TEOS), or combination thereof.

13. The semiconductor structure of claim 12, wherein a bottom surface of the recap layer is concaved toward the conductive layer.

14. The semiconductor structure of claim 11, wherein the material of the lower layer comprises SiC.

15. A memory structure, comprising:
   a first bottom electrode via (BEVA) surrounded by a dielectric layer, the BEVA comprising a copper layer surrounded by a lining layer, the copper layer and the lining layer jointly have a dimpled structure with a top surface lower than a top surface of the dielectric layer;
   a second BEVA adjacent to the first BEVA;
   a first recap layer over the first BEVA; and
   a second recap layer over the second BEVA;
   wherein the first recap layer and the second recap layer are separated by a protection layer over the dielectric layer, and the first recap layer comprising materials different from copper.

16. The memory structure of claim 15, wherein the thickness of the protection layer is in a range from about 50 Å to about 300 Å.

17. The memory structure of claim 15, wherein the dielectric layer comprises a lower layer and an upper layer.

18. The memory structure of claim 17, wherein the top surface of the copper layer is higher than a top surface of the lower layer.

19. The memory structure of claim 17, wherein a portion of the first recap layer is concaved toward the copper layer.

20. The memory structure of claim 15, wherein a width of the dimpled structure is greater than a width of a bottom of the lining layer in the BEVA.

* * * * *